US011573267B1

United States Patent
(12) United States Patent
Onozawa et al.

(10) Patent No.: US 11,573,267 B1
(45) Date of Patent: Feb. 7, 2023

(54) ELECTRONIC COMPONENT HANDLING APPARATUS AND ELECTRONIC COMPONENT TESTING APPARATUS

(71) Applicant: ADVANTEST Corporation, Tokyo (JP)

(72) Inventors: Masataka Onozawa, Tokyo (JP); Yuki Koba, Tokyo (JP)

(73) Assignee: ADVANTEST Corporation, Tokyo (JP)

( * ) Notice: Subject to any disclaimer, the term of this patent is extended or adjusted under 35 U.S.C. 154(b) by 0 days.

(21) Appl. No.: 17/454,669

(22) Filed: Nov. 12, 2021

(51) Int. Cl.
*G01R 31/28* (2006.01)

(52) U.S. Cl.
CPC ....... *G01R 31/2891* (2013.01); *G01R 31/287* (2013.01)

(58) Field of Classification Search
CPC ................ G01R 1/0408; G01R 1/0483; G01R 1/06722; G01R 1/07314; G01R 31/2648; G01R 31/2886; G01R 31/2889; G01R 31/2891
See application file for complete search history.

(56) References Cited

U.S. PATENT DOCUMENTS 7,768,286 B2 * 8/2010 Hosoda .............. G01R 31/2891 324/750.02
2009/0278926 A1 * 11/2009 Kikuchi ............... G01R 35/005 348/135
2018/0356460 A1 * 12/2018 Kato .................. G01R 31/2893

FOREIGN PATENT DOCUMENTS

JP 3227434 U 8/2020

* cited by examiner

*Primary Examiner* — Tung X Nguyen
(74) *Attorney, Agent, or Firm* — Osha Bergman Watanabe & Burton LLP

(57) ABSTRACT

An electronic component handling apparatus handles a DUT and includes: an acquiring device that acquires current three-dimensional shape data of a DUT container having a plurality of accommodating portions each capable of accommodating the DUT; and a computer device that: calculates a first correction amount from the current three-dimensional shape data and corrects the current three-dimensional shape data based on the first correction amount; extracts, from the corrected three-dimensional shape data, at least one of a height and a slope of each of predetermined regions of the DUT container; and determines an accommodation state of the DUT based on an extraction result. The first correction amount represents at least one of a movement amount and a rotation amount in a planar direction of the current three-dimensional shape data with respect to an initial state of the DUT container set in advance.

10 Claims, 12 Drawing Sheets

ELECTRONIC COMPONENT HANDLING APPARATUS AND ELECTRONIC COMPONENT TESTING APPARATUS

BACKGROUND

Technical Field

The present invention relates to an electronic component handling apparatus that handles the DUT for testing the electronic component under test (DUT: Device Under Test) such as a semiconductor integrated circuit device, and an electronic component testing apparatus including the electronic component handling apparatus.

Description of Related Art

As an electronic component handling apparatus, there is known a device including an accommodation state determining device for acquiring three-dimensional shape data of a DUT container such as a customer tray accommodating an untested DUT and determining an accommodation state of the DUT.

PATENT DOCUMENT

Patent Document 1: JP 3227434 U

When the above-mentioned DUT container is used in a high-temperature chamber, the DUT container may be deformed by heat to cause a deviation between the measurement area and the actual position of the DUT, and therefore, the storage state of the DUT may not be correctly determined. In the electronic component handling apparatus described above, when a pocket in which a DUT is not accommodated exists in the DUT container, the pick-and-place device may stop due to the pocket. Further, when the DUT is accommodated in a pocket of the DUT container in a tilted state, or when two DUTs are accommodated in one pocket in an overlapping manner, the pick-and-place device may damage the DUT.

SUMMARY

One or more embodiments of the present invention provide an electronic component handling apparatus capable of reducing the damage of the improvement and DUT operating rate, and, an electronic component testing apparatus having the electronic component handling apparatus.

[1] An electronic component handling apparatus according to one or more embodiments of the present invention is an electronic component handling apparatus that handles a DUT, the electronic component handling apparatus comprising: an acquiring device (e.g., a sensor) that acquires three-dimensional shape data (e.g., current three-dimensional shape data) of a DUT container (e.g., a buffer plate) having a plurality of accommodating portions (e.g., pockets) capable of accommodating the DUT; a first correcting device (e.g., a computer device) that calculates a first correction amount from the shape data and corrects the shape data based on the first correction amount; an extracting device (e.g., the computer device) that extracts a height and/or a slope of a predetermined region corresponding to the DUT in the accommodating portion from the shape data corrected by the first correcting device; and a determining device (e.g., the computer device) that determines an accommodation state of the DUT in the accommodating portion based on an extraction result of the extracting device, wherein the first correction amount represents a movement amount and/or a rotation amount in a planar direction of the shape data with respect to an initial state of the DUT container set in advance.

[2] In one or more embodiments, the electronic component handling apparatus further may include a second correction device (e.g., the computer device) that calculates a second correction amount from the shape data and corrects a relative positional relationship between a plurality of the predetermined regions based on the second correction amount, and the second correction amount may be a change amount of the relative positional relationship of the accommodating portion with respect to the initial state.

[3] In one or more embodiments, the DUT container may be provided with a plurality of first reference points (e.g., reference marks), the initial state may include three-dimensional shape data (e.g., initial three-dimensional shape data) of the DUT container at room temperature acquired by the acquiring device, and the first correction device may calculate the first correction amount based on the first reference point in the shape data and the first reference point in the initial state.

[4] In one or more embodiments, the electronic component handling apparatus may include a holding device (e.g., a buffer plate moving device) that holds the DUT container, the acquiring device may acquire a specific position of a jig held by the holding device or a specific position of the holding device, and the initial state may include a coordinate system set based on the specific position.

[5] In one or more embodiments, the DUT container may be provided with a plurality of first reference points (e.g., reference marks), and the second correction device may calculate the second correction amount based on the number of the accommodating portions and the first reference point of the shape data.

[6] In one or more embodiments, the electronic component handling apparatus may further comprise a holding device (e.g., a buffer plate moving device) that holds the DUT container, and a setting device (e.g., the computer device) that sets the predetermined region, wherein the acquiring device may acquire a specific position of a jig held by the holding device or a specific position of the holding device, the second correcting device corrects a positional relationship between a plurality of the predetermined regions in a design data of the predetermined region, and the setting device may set the predetermined region by applying the design data of the predetermined region corrected by the second correcting device to the shape data based on a coordinate system set from the specific position.

[7] In one or more embodiments, the DUT container may be provided with a plurality of second reference points (e.g., reference marks) corresponding to the plurality of accommodating portions, and the electronic component handling apparatus may further include a setting device (e.g., the computer device) that sets the predetermined region with respect to the shape data based on the second reference points.

[8] In one or more embodiments, the determining device may determine that the DUT is not accommodated in the accommodating portion when the height of the predetermined region is less than a first threshold, determine that the DUT is accommodated in the accommodating portion when the height of the predetermined region is greater than a second threshold greater than the first threshold, determine that the DUT is tilted in the accommodating portion when the incline of the predetermined region is less than a third threshold or greater than a fourth threshold greater than the third threshold, and determine that the DUT is normally accommodated in the accommodating portion when the height of the predetermined region is greater than or equal to the first threshold, less than or equal to the second threshold, and the tilt of the predetermined region is greater than or equal to the third threshold and less than or less than the fourth threshold.

[9] In one or more embodiments, the acquiring device may include a sensor that acquires three-dimensional shape data of the DUT container by a light cutting method.

[10] In one or more embodiments, the electronic component handling apparatus may include a chamber that applies thermal stress to the DUT, and the DUT container may have a plurality of concave pockets that receives the DUT and may be a buffer plate disposed or accessible within the chamber.

[11] An electronic component testing apparatus according to one or more embodiments of the present invention is an electronic component testing apparatus that tests a DUT, comprising: a test head having a socket to which the DUT is electrically connected, the above-described electronic component handling apparatus that moves the DUT to press the DUT against the socket, and a tester electrically connected to the test head.

According to one or more embodiments of the present invention, the acquiring device acquires the three-dimensional shape data of the DUT container, the first correcting device calculates the first correction amount for the initial state from the shape data to correct the shape data, the extracting device extracts the height and the incline of the predetermined region from the shape data after correction, and the determining device determines the accommodation state of the DUT based on the extraction result. Thus, according to one or more embodiments of the present invention, the accommodation state of the DUT is determined after correcting the deviation with respect to the initial state of the DUT container due to rotation or movement. This allows to improve the determination accuracy of the accommodation state of the DUT and the operation rate of the electronic component handling apparatus, and avoid the damage of the DUT.

BRIEF DESCRIPTION OF DRAWINGS

FIG. 7A is a diagram showing the shape data before correction, and FIG. 7B is a diagram showing the shape data after correction.

FIG. 8A is a diagram showing the shape data before correction, and FIG. 8B is a diagram showing the shape data after correction.

FIG. 9A is a diagram showing the elongation of the shape data with respect to the initial state, FIG. 9B is a diagram showing a state of setting a predetermined region with respect to the shape data.

FIG. 11A is a diagram showing a state in which the accommodation state of the DUT is normal, and FIGS. 11B-11D are diagrams showing a state in which the accommodation state of the DUT is abnormal.

DETAILED DESCRIPTION OF EMBODIMENTS

Hereinafter, embodiments of the present invention will be described with reference to the drawings.

Figure 1:
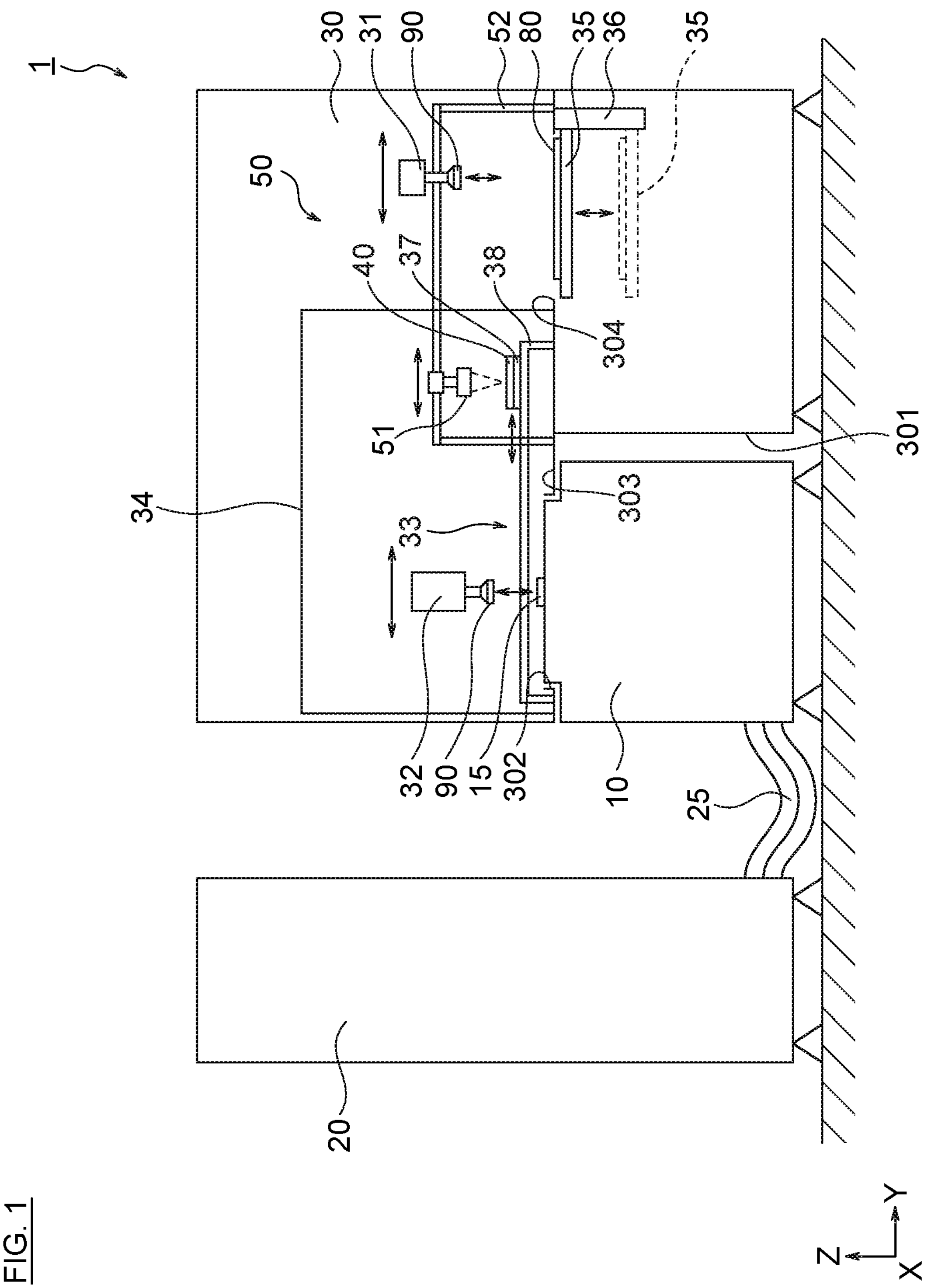
FIG. 1 is a schematic cross-sectional view showing an electronic component testing apparatus according to one or more embodiments of the present invention.
Figure 2:
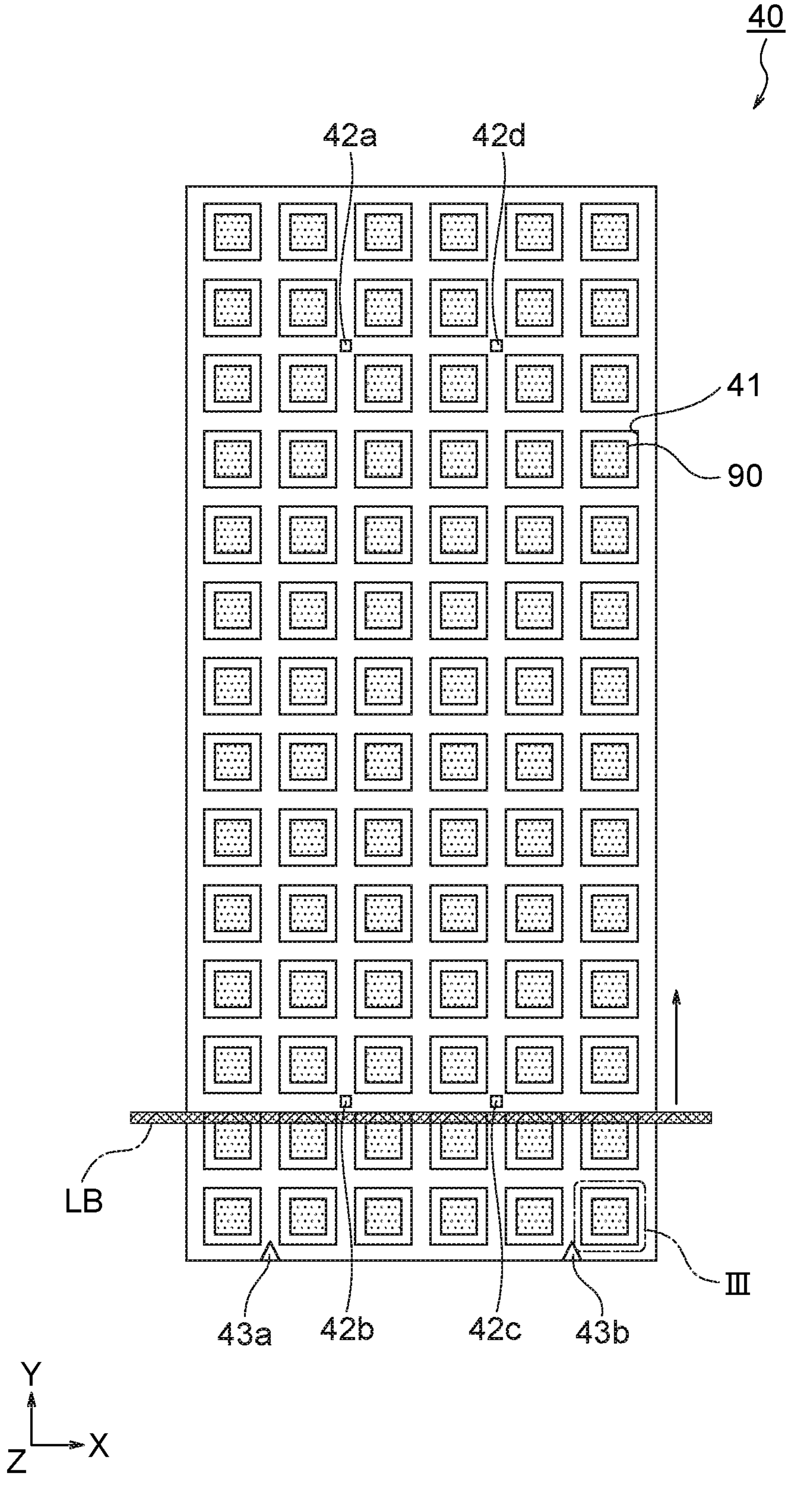
FIG. 2 is a plan view showing a buffer plate used in one or more embodiments of the present invention.
Figure 3:
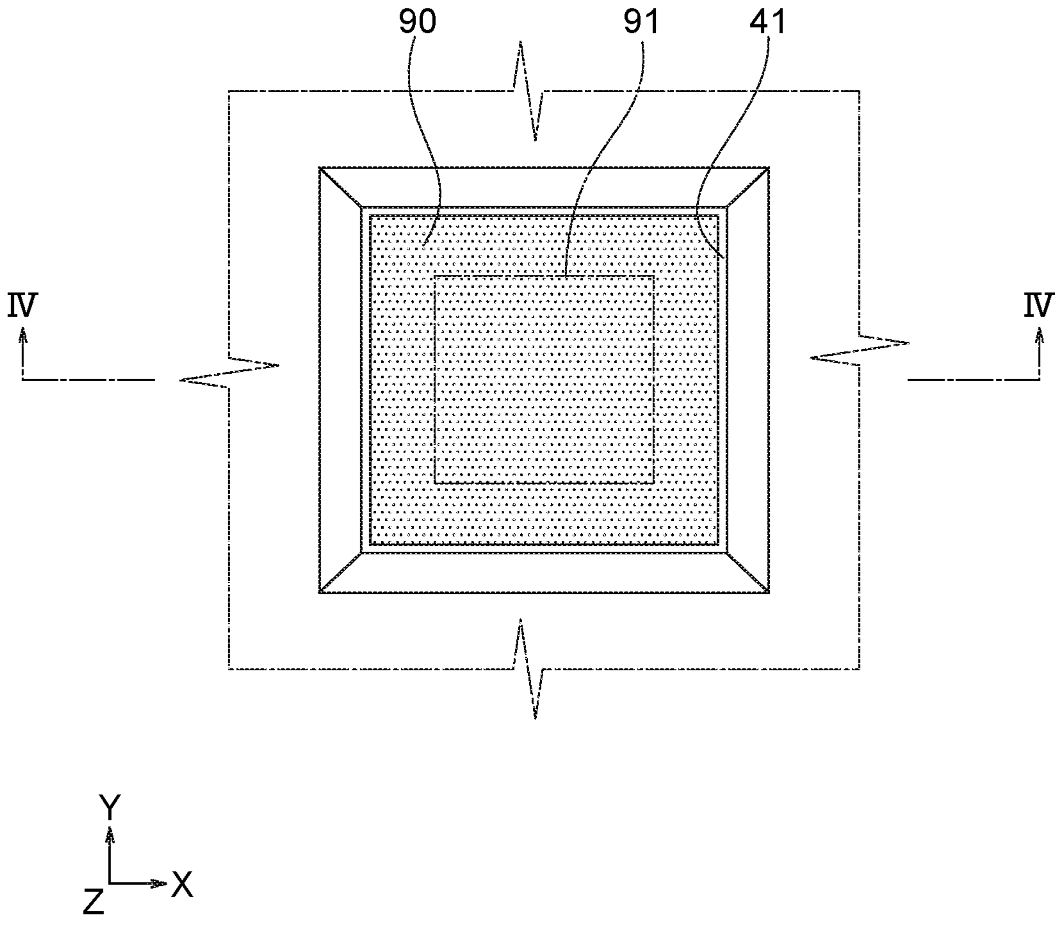
FIG. 3 is an enlarged view of part III of FIG. 2.
Figure 4:
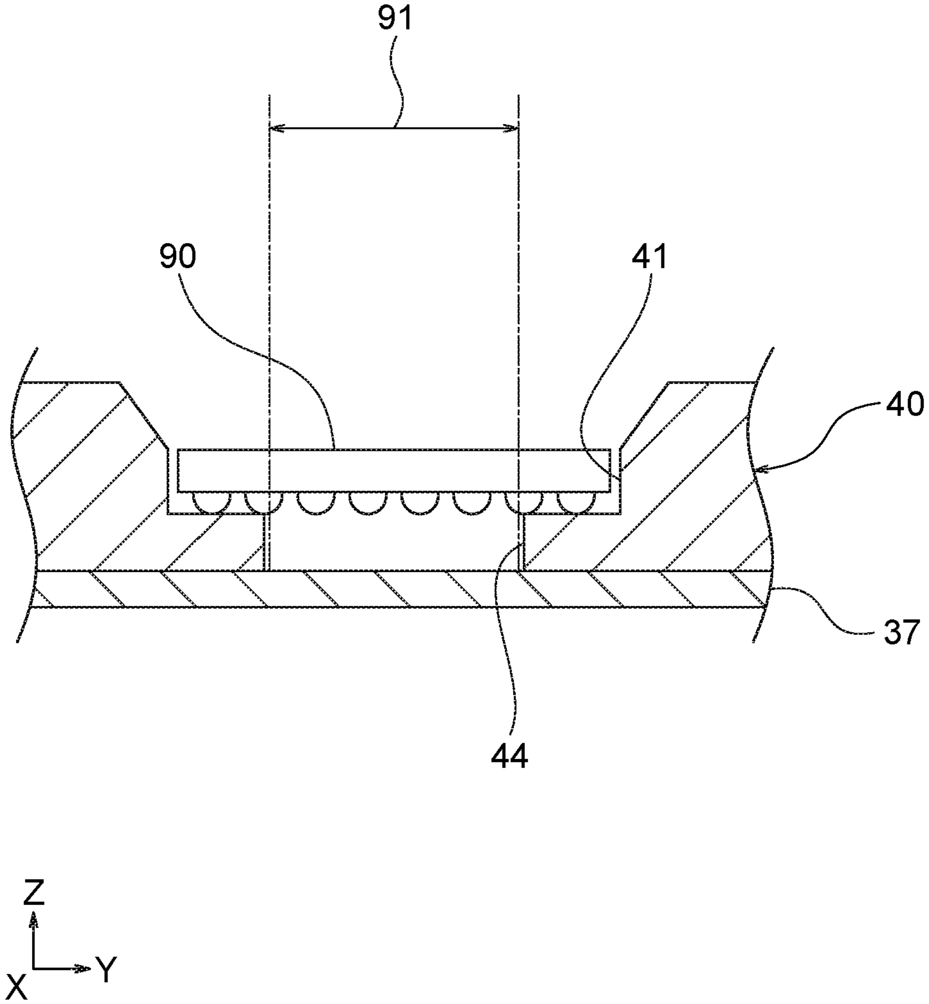
FIG. 4 is a cross-sectional view taken along IV-IV of FIG. 3.
Figure 5:
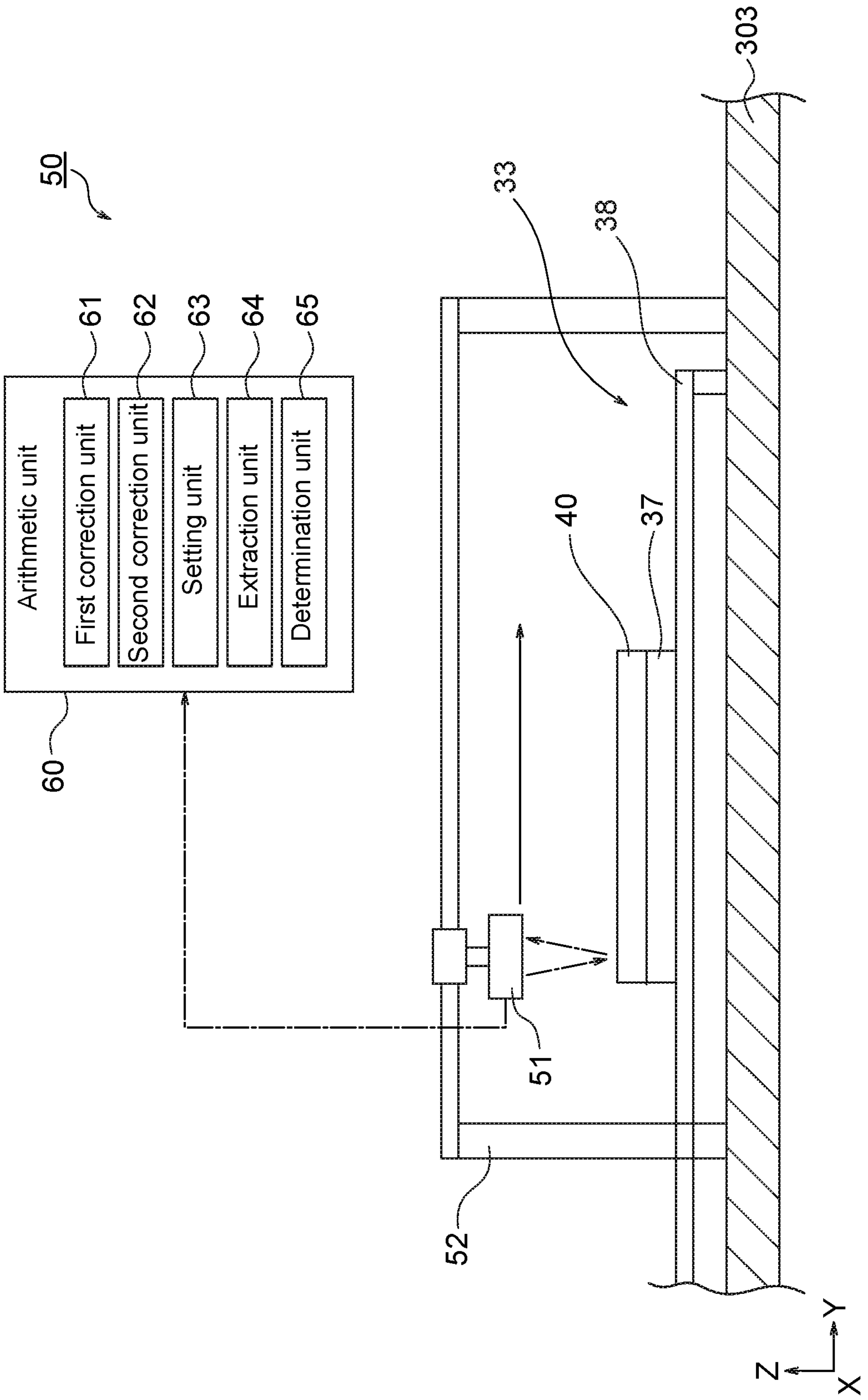
FIG. 5 is a diagram illustrating a configuration of an accommodation state determining device according to one or more embodiments of the present invention.

FIG. 1 is a schematic cross-sectional view showing an electronic component testing apparatus 1 in the present embodiment, FIG. 2 is a plan view showing a buffer plate 40 (i.e., a DUT container) used in this embodiment, FIG. 3 is an enlarged view of the III portion of FIG. 2, FIG. 4 is a cross-sectional view taken along IV-IV of FIG. 3, FIG. 5 is a diagram showing the configuration of an accommodation state determining device 50 in the present embodiment.

As shown in FIG. 1, the electronic component testing apparatus 1 includes a test head 10, a tester (main frame) 20, and a handler 30. The test head 10 has sockets 15 to which a DUT 90 is electrically connected during testing. A tester 20 is connected to the test head 10 via a cable 25. The tester 20 sends test signals to the DUT 90 via the test head 10 and performs a test of the DUT 90. The test head 10 is disposed interchangeably in a space 301 formed in a lower portion of the handler 30, and the socket 15 is inserted into the handler 30 through an opening 302 formed in the handler 30.

The handler 30 includes a pick and place device 31, a contact arm 32, a buffer plate moving device (i.e., a holding device) 33, and a chamber 34. The handler 30 is a device that picks up an untested DUT 90 from a customer tray 80 and conveys it onto the test head 10, and presses the DUT 90 against the socket 15 to electrically connect the DUT 90 to the socket 15.

Here, the customer tray 80 is a tray that conforms to JEDEC (Joint Electron Device Engineering Council) standard. This customer tray 80 is made of, for example, a resin material.

The customer tray 80 in which the untested DUT 90 is accommodated is accommodated in a stocker (not shown) and set on the state side of the main base (device substrate) 303 of the handler 30. The customer tray 80 is conveyed from the stocker to the set plate 35 by a tray transfer arm (not shown). The customer tray 80 is raised by the lifting device 36 along with the set plate 35, is exposed from the main base 303 through the opening 304 of the main base 303, and is positioned at the loader portion of the handler 30.

The pick-and-place device 31 picks up the untested DUT 90 from the customer tray 80 and transfers the DUT 90 to the buffer plate 40 attached to the buffer plate moving device 33.

The buffer plate moving device 33 includes a base plate 37, a rail 38, and an actuator (not shown). The buffer plate moving device 33 conveys the buffer plate 40 mounted on the base plate 37 along the rail 38 onto the test head 10.

The contact arm 32 picks up the DUT 90 from the buffer plate 40 carried on the test head 10 and presses the DUT 90 against the socket 15. As a result, the DUT 90 is electrically connected to the sockets 15. In this condition, the tester 20 executes the DUT 90 test.

The chamber 34 is arranged to surround the socket 15 and the buffer plate moving device 33 on the test head 10. The chamber 34 is provided with a constant temperature bath composed of a heat insulating material or the like. The chamber 34 can keep the temperature of the inner atmosphere constant since the inside of the chamber is not susceptible to temperature changes from the surrounding environment. Further, the chamber 34 is provided with a temperature adjusting device for adjusting the temperature of the atmosphere in the thermostatic bath, it is possible to apply a high-temperature or low-temperature thermal stress of interest to the DUT 90. As a specific example of such a temperature adjusting device, for example, a heating device such as a heater, a cooling device using liquid nitrogen, or the like can be exemplified.

Here, as shown in FIGS. 2-4, the buffer plate 40 is a plate-shaped tray having a plurality of pockets (i.e., accommodating portions) 41. Each of the pockets 41 is a recess capable of accommodating the DUT 90. Such pockets 41 are formed in a matrix shape in the buffer plate 40. The buffer plate 40 is made of, for example, a metal material such as aluminum. A plurality of reference marks 42 and 43 are formed on the buffer plate 40. In the present embodiment, four reference marks 42*a* to 42*d* and two reference marks 43*a* and 43*b* are formed on the buffer plate 40, but the number of the reference marks 42 and 43 is not particularly limited thereto. The buffer plate 40 is detachably fixed to (or held by) the base plate 37 of the buffer plate moving device 33 and can be replaced according to the type of the DUT.

Although FIGS. 1 and 5 show the buffer plate moving device 33 and the buffer plate 40 provided in the loader portion of the handler 30, the unloader portion of the handler 30 is also provided with the buffer plate moving device and the buffer plate having the same configuration. The buffer plate provided in the unloader section can enter the chamber 34 by a buffer plate moving device.

As shown in FIGS. 1 and 5, the handler 30 includes an accommodation status determining device 50 that determines whether the DUT 90 is normally accommodated in the pockets 41 of the buffer plate 40. The accommodation state determining device 50 includes a sensor 51 (i.e., an acquiring device), a moving device 52, and an arithmetic unit (i.e., a computer device) 60. In FIGS. 1 and 5, the accommodation state determining device 50 provided in the loader portion of the handler 30 is illustrated, but the unloader portion of the handler 30 is also provided with the accommodation state determining device having the same configuration.

The sensor 51 is a sensor for measuring the three-dimensional shape of the buffer plate 40 held in the base plate 37 in a non-contact manner. As a specific example of the measurement method of the three-dimensional shape of the non-contact method, for example, a light cutting method can be exemplified. The sensor 51 includes, for example, a light irradiation unit for forming a linear light cutting line on the surface of the measurement object by irradiating a linear laser beam LB (see FIGS. 2 and 10) with respect to the measurement object, and an imaging unit for imaging the light cutting line. Incidentally, the method of measuring the three-dimensional shape of the buffer plate 40 is not limited to the light cutting method described above, for example, it may be measured three-dimensional shape of the buffer plate 40 using other techniques such as a fringe projection method or a laser displacement meter.

The moving device 52 is a device that moves the sensor 51 along the Y direction in the drawing. The moving device 52 is provided on the main base 303 and can relatively move the sensor 51 with respect to the buffer plate 40 which is held by the base plate 37. While relatively moving the sensor 51 relative to the buffer plate 40 by the moving device 52, by imaging the light cutting rays formed on the surface of the buffer plate 40 by irradiating a laser beam LB with respect to the buffer plate 40 by the sensor 51, the sensor 51 can acquire three-dimensional shape data of the surface.

Three-dimensional shape data of the buffer plate 40 acquired by the sensor 51 is transmitted to the arithmetic unit 60. The arithmetic unit 60, for example, is composed of a computer including a CPU, ROM, RAM, or the like. The arithmetic unit 60 of the present embodiment functionally includes a first correction unit 61, a second correction unit 62, a setting unit 63, an extraction unit 64, and a determination unit 65. These functions 61 to 65 are implemented by software installed in the computer comprising the arithmetic unit 60.

Hereinafter, the functions of the respective units 61 to 65 included in the arithmetic unit 60 will be described by referring to FIGS. 6-11B, together with the explanation of the procedures for determining the DUT 90 accommodation state by the accommodation state determining device 50.

Figure 6:
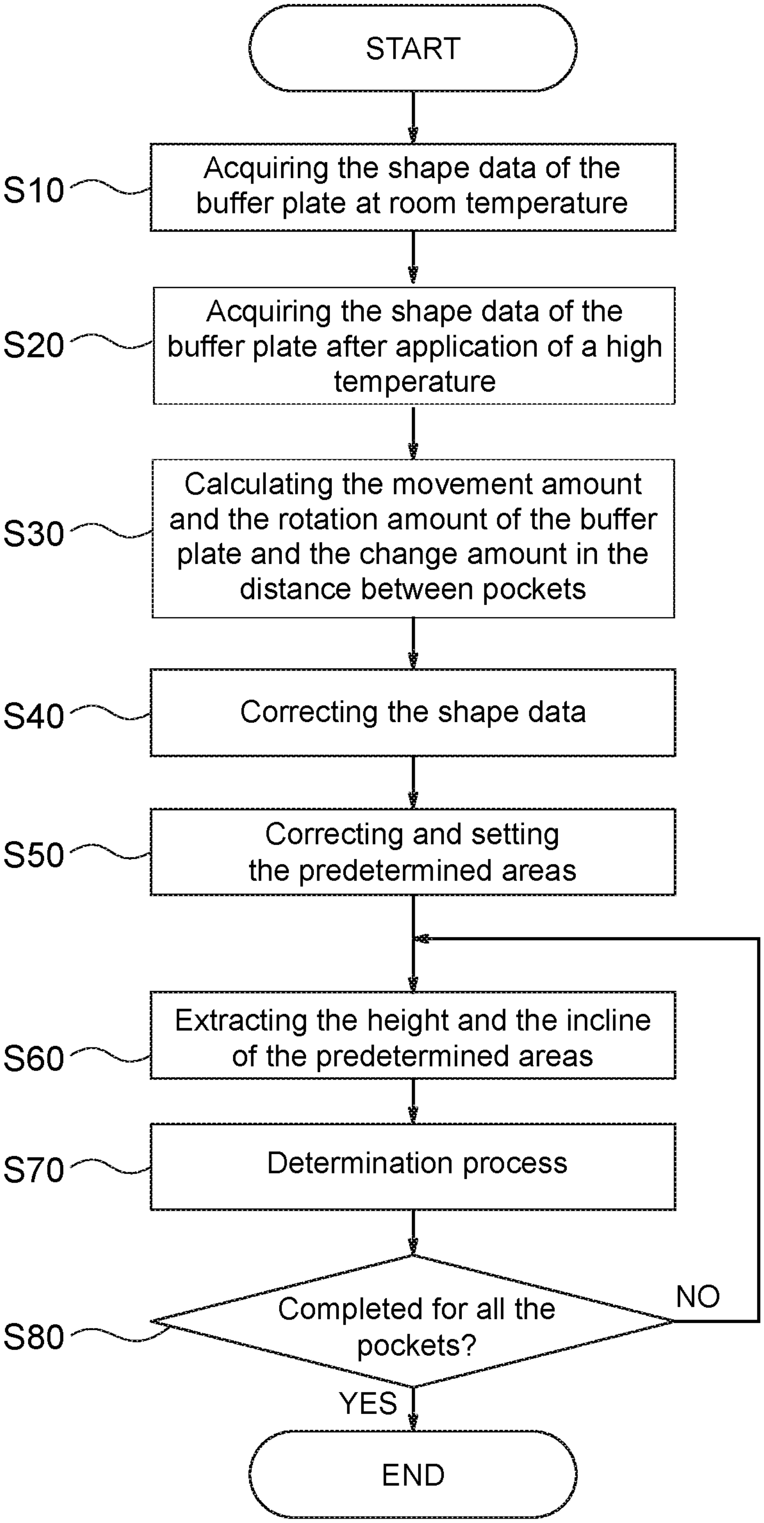
FIG. 6 is a flowchart illustrating a determination method by the accommodation state determining device according to one or more embodiments of the present invention.
Figure 7B:
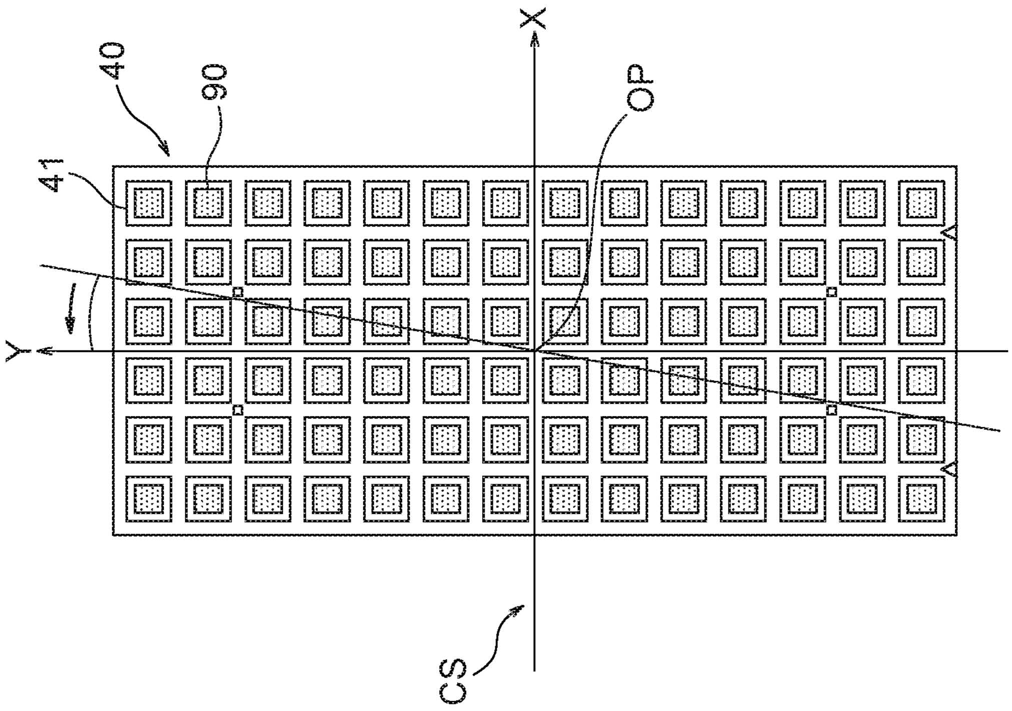
FIGS. 7A-7B are diagrams (1) for explaining the correction processing of the shape data of the buffer plate in step S40 of FIG. 6 (in one or more embodiments of the present invention)
Figure 7A:
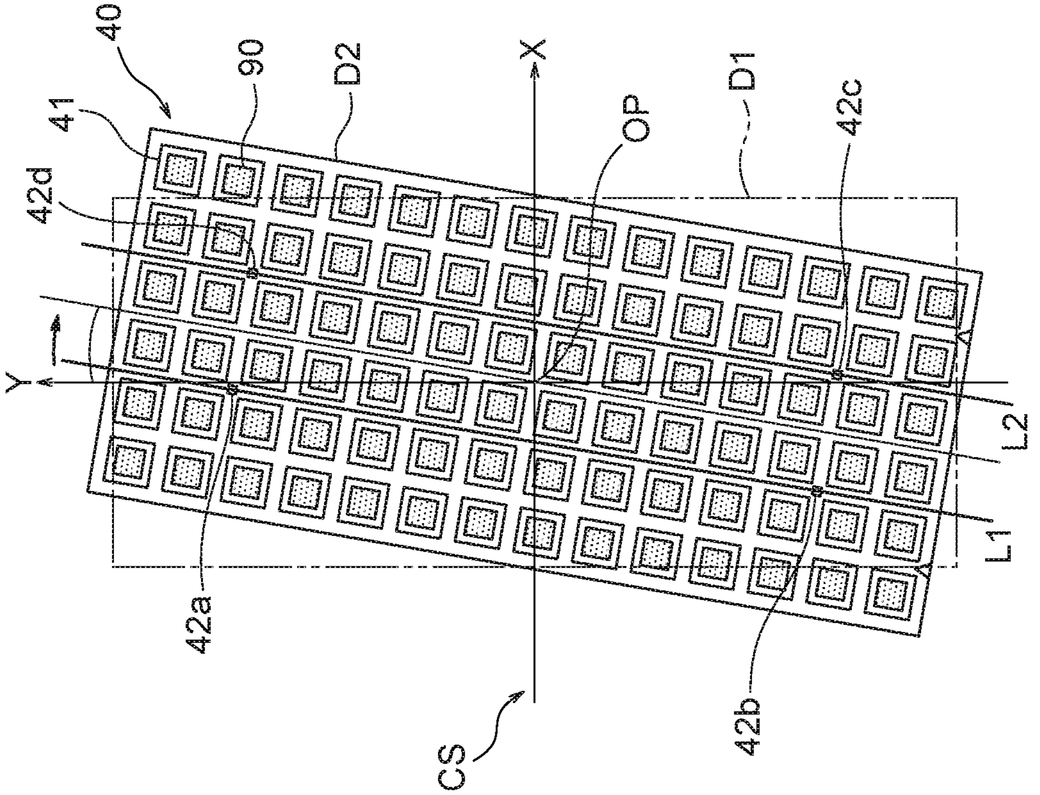
Figure 8B:
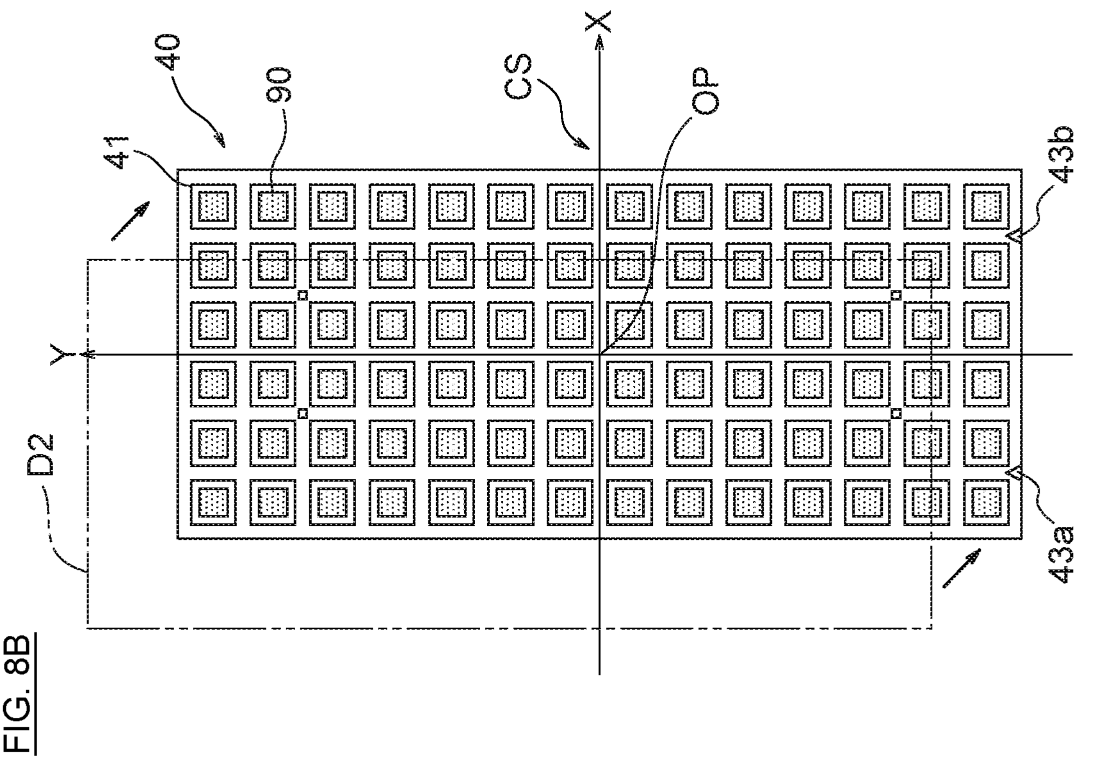
FIGS. 8A-8B are diagrams (2) for explaining the correction processing of the shape data of the buffer plate in step S40 of FIG. 6.
Figure 8A:
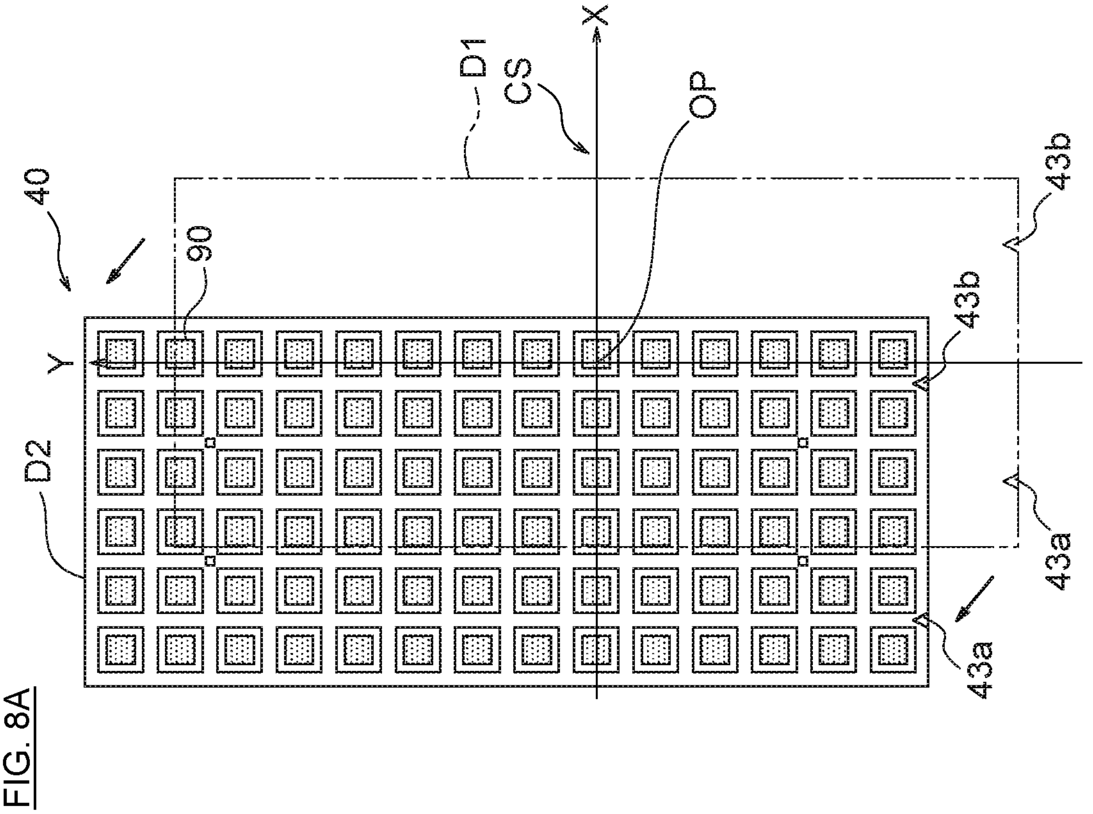
Figure 9B:
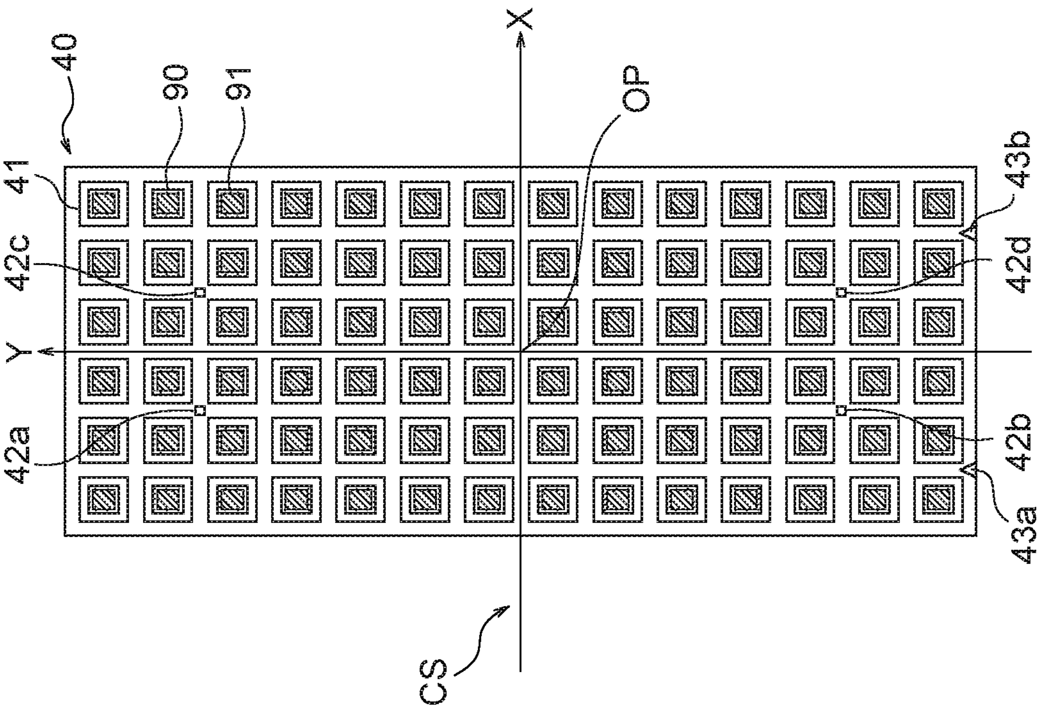
FIGS. 9A-9B is a diagram for explaining the setting process of a predetermined region of the buffer plate in step S50 of FIG. 6.
Figure 9A:
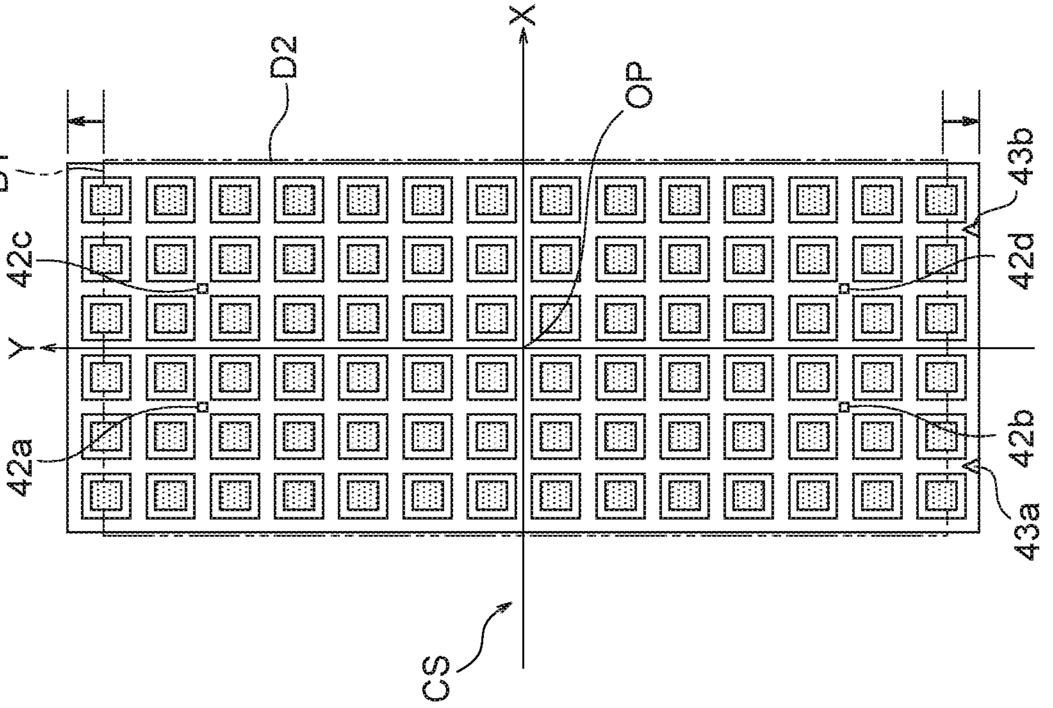
Figure 10:
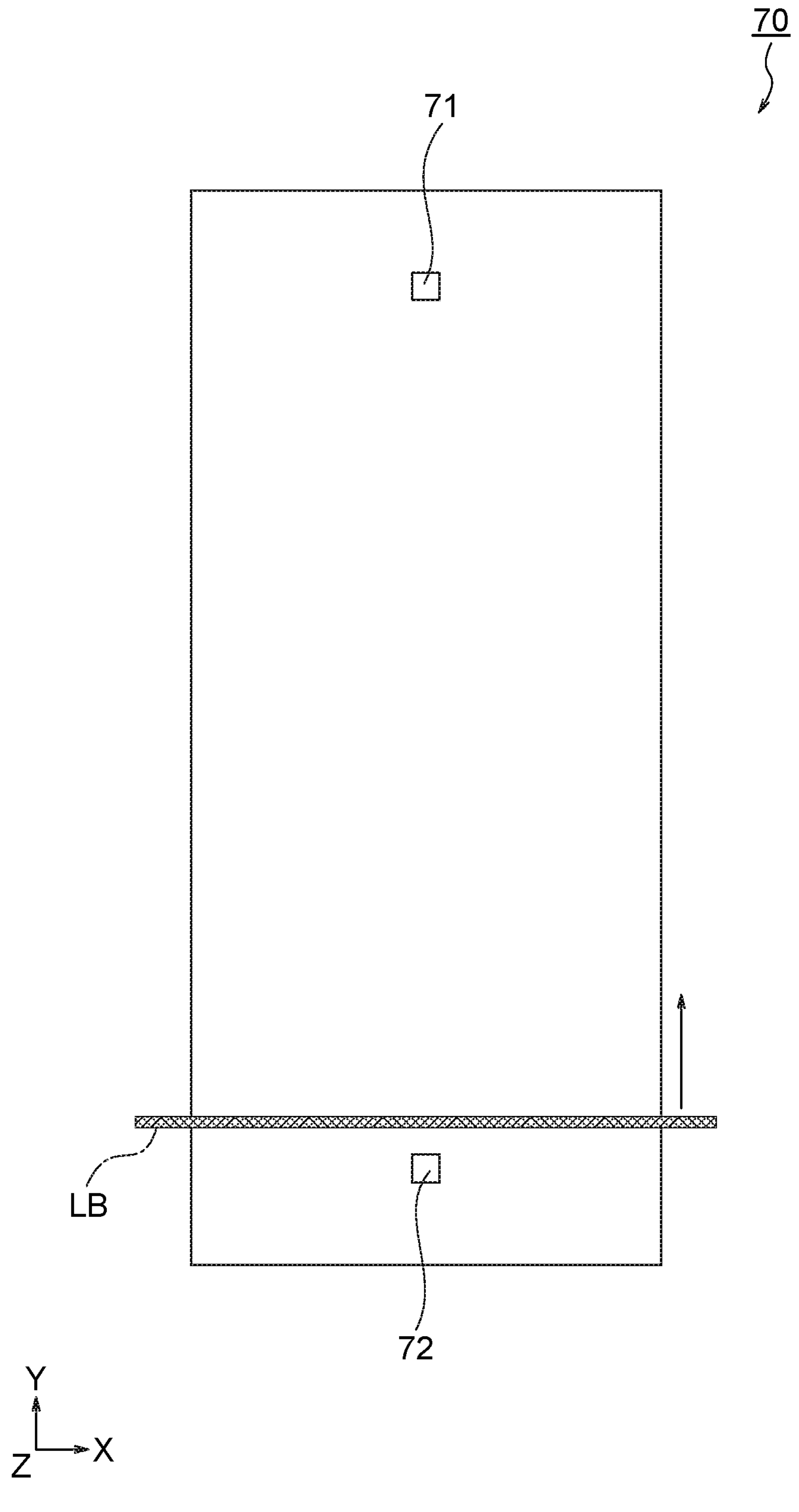
FIG. 10 is a plan view showing a jig used in one or more embodiments of the present invention.

FIG. 6 is a flowchart showing a determination method by the accommodation state determining device 50 in the present embodiment, FIGS. 7A-7B are diagrams for explaining correction processing of shape data of the buffer plate 40 in step S40 of FIG. 6, FIGS. 8A-8B are diagrams for explaining correction processing of shape data of the buffer plate 40 in step S40 of FIG. 6, FIGS. 9A-FIG. 9B are diagrams for explaining setting processing of the predetermined region 91 of the buffer plate 40 in step S50 of FIG. 6, FIG. 10 is a plan view showing the jig 70 used in the present embodiment, and FIGS. 11A-11D are diagrams for showing determination processing of step S70 of FIG. 6.

First, in step S10 of FIG. 6, while the sensor 51 measures the shape of the surface of the buffer plate 40 at room temperature, the accommodation state determining device 50 moves the sensor 51 relative to the buffer plate 40 by the moving device 52. As a result, the three-dimensional shape data D1 (point data group) in the initial state of the buffer plate 40 held by the base plate 37 is acquired. The three-dimensional shape data D1 constitutes data indicating the initial state of the buffer plate 40 together with design data of the coordinate system CS and the predetermined region 91, which will be described later. The shape data D1 in the initial state of the buffer plate 40 is transmitted from the sensor 51 to the arithmetic unit 60. This step S10 is performed prior to starting the temperature regulation in the chamber 34, for example, when activating the handler 30 or when replacing the buffer plate 40 with a the DUT 90 variety change.

Next, in step S20 of FIG. 6, the inside of the chamber 34 is set to a predetermined temperature, and in a state where the buffer plate 40 is heated, the accommodation state determining device 50 acquires three-dimensional shape data D2 of the buffer plate 40 in the same manner as in step S10. The shape data D2 is transmitted from the sensor 51 to the arithmetic unit 60 and stored therein.

Here, the buffer plate 40 may move or rotate from the position of the initial state by a high temperature heat stress (see FIGS. 7A and 8A) and the length of the buffer plate 40 itself may be deformed to be extended (see FIG. 9A), because the buffer plate 40 is made of a metal material such as aluminum.

In step S30 of FIG. 6, the first correction unit 61 of the arithmetic unit 60, for the shape data D2, acquires the amount of rotation in the XY plane with respect to the shape data D1 of the buffer plate 40 at room temperature. Specifically, the first correction unit 61 measures the positions of the four reference marks 42*a* to 42*d* on the buffer plate 40 from the shape data D2 of the buffer plate 40 after the application of a high temperature. The first correction unit 61, as shown in FIG. 7A, obtains the average value of the slope with respect to the coordinate system CS of the virtual straight line L1 connecting the reference mark 42*a*, 42*b*, and the inclination with respect to the coordinate system CS of the virtual straight line L2 connecting the reference mark 42*c*, 42*d*, to calculate the amount of rotation in the XY plane of the shape data D2 of the buffer plate 40 from the initial state. The coordinate system CS is a coordinate system in which the center position of the buffer plate 40 in the initial state is set as the origin OP by a method to be described later, and is stored in the arithmetic unit 60. The coordinate system CS is included in data indicating the initial state of the buffer plate 40.

Further, in step S30, the first correction unit 61, for the shape data D2, acquires the amount of movement in the XY plane from the shape data D1 of the buffer plate 40 at room temperature. Specifically, the first correction unit 61, as shown in FIG. 8A, measures two reference marks 43*a* and 43*b* on the buffer plate 40 from the shape data D2 of the buffer plate 40 and compares positions of reference marks 43*a* and 43*b* of the shape data D2 and positions of reference marks 43*a* and 43*b* of the shape data D1 of the buffer plate 40 at room temperature obtained in step S10 described above to calculate the amount of movement in the XY plane of the buffer plate 40 from the initial state.

Incidentally, in step S30, the first correcting unit 61 may calculate the rotational amount of the shape data D2 of the buffer plate 40 in the XY plane from the initial state by obtaining the virtual linear L1,L2 from the shape data D2 of the buffer plate 40 after high temperature application and comparing with the virtual linear L1,L2 of the buffer plate 40 at room temperature obtained in step S10 described above. Further, in this step S30, the first correction unit 61 may calculate the movement amount of the shape data D2 of the buffer plate 40 in the XY plane from the initial state by obtaining the center position of the shape data D2 of the buffer plate 40 after high temperature application and comparing with the origin OP of the coordinate system CS described above. Alternatively, the first correction unit 61 may calculate only one of the rotation amounts and the movement amount.

Furthermore, in step S30 of FIG. 6, the second correction unit 62 of the arithmetic unit 60 acquires the amount of change in the distance between the pocket 41 in the plane direction from the initial state (pitch change). Specifically, as shown in FIG. 9A, the second correction unit 62 calculates the average value of the pocket distance of the pocket 41 in the buffer plate 40 after high temperature application from the distance between the reference mark 42*a* and 42*b* (or reference mark 42*c*, the distance between 42*d*) in the shape data D2 of the buffer plate 40 after high temperature application and from the number of pockets 41 present between the reference marks 42*a*, 42*b*. Similarly, the average value of the inter-pocket distance in the initial state is calculated from the shape data D1 of the buffer plate 40 at room temperature acquired in step S10. Then, by comparing the average value of the distance between pockets after high temperature application and the average value of the distance between pockets in the initial state, the amount of deformation of the distance between pockets from the initial state (pitch change amount) is calculated. Incidentally, instead of the shape data D1 of the buffer plate 40 at room temperature obtained in step S10 described above, from the design data of the predetermined region 91 to be described later, the average value of the distance between pockets in the initial state may be calculated.

Next, in step S40 of FIG. 6, the first correction unit 61 corrects the shape data D2 of the buffer plate 40 based on the rotation amount and the movement amount in the XY plane calculated in step S30. Specifically, as shown in FIG. 7B, the first correction unit 61 rotates the angle of the shape data D2 the direction opposite to the calculated rotation direction by the calculated rotation amount, as shown in FIG. 8B, moves the position of the shape data D2 the direction opposite to the calculated movement direction by the calculated movement amount. Thus, the angle of the buffer plate 40 in the shape data D2 coincides with the angle in the initial state, and the center position of the buffer plate 40 in the shape data D2 coincides with the center position of the buffer plate 40 in the initial state (the origin OP of the coordinate system CS).

Next, in step S50 of FIG. 6, the second correction unit 62 corrects the design data of the predetermined region 91 based on the pitch change amount of the pocket 41 calculated in step S30. The predetermined region 91 is a region corresponding to the DUT 90 in the pockets 41 of the buffer plate 40. In the present embodiment, as shown in FIGS. 3-4, the predetermined region 91 is a rectangular region corresponding to the central portion of the DUT 90 accommodated in the pocket 41 of the buffer plate 40, and is set to a region approximately equal to the opening 44 formed in the bottom portion of the pocket 41.

Here, the design data such as the position of each predetermined region 91 for each pocket 41 of the buffer plate 40 in the initial state (room temperature) is stored in advance in the arithmetic unit 60. The design data of the predetermined region 91 is data of a predetermined region group including a plurality of predetermined regions 91 respectively corresponding to the plurality of pockets 41 of the buffer plate 40. When the origin of the design data is made to coincide with the origin OP of the coordinate system CS, the plurality of predetermined regions 91 included in the design data are respectively coincident with the plurality of pockets 41 included in the buffer plate 40 in the initial state acquired in step S10 described above, and the design data is included in the data indicating the initial state of the buffer plate 40.

In step S50, the second correction unit 62 corrects the positional relationship of each predetermined region 91 in the design data of the predetermined region 91 based on the pitch change amount calculated in step S30. Specifically, the second correction unit 62 corrects the distance between the predetermined region 91 in the design data to spread the positional relationship between each predetermined region 91 at the calculated pitch change amount.

Furthermore, in step S50, the setting unit 63 sets the predetermined region 91 by fitting the design data of the predetermined region 91 corrected by the second correction unit 62 with the shape data of the buffer plate 40 corrected by the first correction unit 61 based on the position of the origin OP of the coordinate system CS (refer to FIG. 9B).

The origin OP and the coordinate system CS stored in the arithmetic unit 60 are specifically determined as follows.

First, instead of the buffer plate 40, the jig 70 shown in FIG. 10 is set on the base plate 37. The jig 70 is a plate having substantially the same outer shape as the buffer plate 40. The jig 70 has two convex portions 71 and 72 in the vicinity of the upper and lower ends in the drawing. The accommodation state determining device 50, in the same manner as in step S10 described above, acquires the three-dimensional shape data of the entire jig 70 by the sensor 51, and transmits the shape data to the arithmetic unit 60. The information of the coordinate system CS with middle point of the convex portions 71 and 72 in the shape data of the jig 70 as the origin OP and a straight line connecting the convex portions 71 and 72 as the Y-axis is stored in the arithmetic unit 60. Since the external shapes of the jig 70 and the buffer plate 40 are substantially the same, the position of the origin OP corresponds to the position of the center of the buffer plate 40 at normal temperature.

In the present embodiment, the position of the origin OP of the coordinate system CS is determined using the jig 70, the setting method of the origin OP is not particularly limited thereto. For example, a reference point (or a reference mark) may be provided on the base plate 37 of the buffer plate moving device 33 instead of the jig 70, and the reference point OP and the coordinate system CS may be set using the reference point of the base plate 37.

In the present embodiment, as described above, the shape data D2 of the buffer plate 40 is corrected by the first correction unit 61 in step S40 based on the rotation amount and/or the movement amount of the buffer plate 40 calculated in step S30, and then the predetermined region 91 is set in step S50. Thus, in the present embodiment, the predetermined region 91 is set after correcting the deviation from the initial state due to the rotation or movement of the buffer plate 40. This allows to set the predetermined region 91 to an appropriate position of the shape data of the buffer plate 40 and to improve the determination accuracy of the accommodation state of the DUT 90.

In the present embodiment, as described above, the design data of the predetermined region 91 is corrected by the second correction unit 62 in step S50 based on the pitch change amount of the pocket 41 calculated in step S30, and then the predetermined region 91 is set. Thus, in the present embodiment, the predetermined region 91 is set after correcting the deviation from the initial state due to the elongation of the buffer plate 40. This allows to set the predetermined region 91 to an appropriate position of the shape data of the buffer plate 40 and to improve the determination accuracy of the accommodation state of the DUT 90.

Next, in step S60 of FIG. 6, the extraction unit 64 of the arithmetic unit 60 extracts the height H and the incline θ of the predetermined region 91. Specifically, the extraction unit 64 calculates the height H of the predetermined region 91 by calculating the average value of the heights of the point data groups in the predetermined region 91. Further, the extraction unit 64 creates a plane from the point data group in the predetermined region 91, by calculating the incline with respect to the vertical direction of the plane, obtains the inclination θ of the predetermined region 91.

Next, in S70 of the drawing, the determination unit 65 of the arithmetic unit 60 determines the accommodation condition of the DUT 90 in the pockets 41 using the height H and the slope θ of the predetermined region 91 extracted by the extraction unit 64.

Figure 11A:
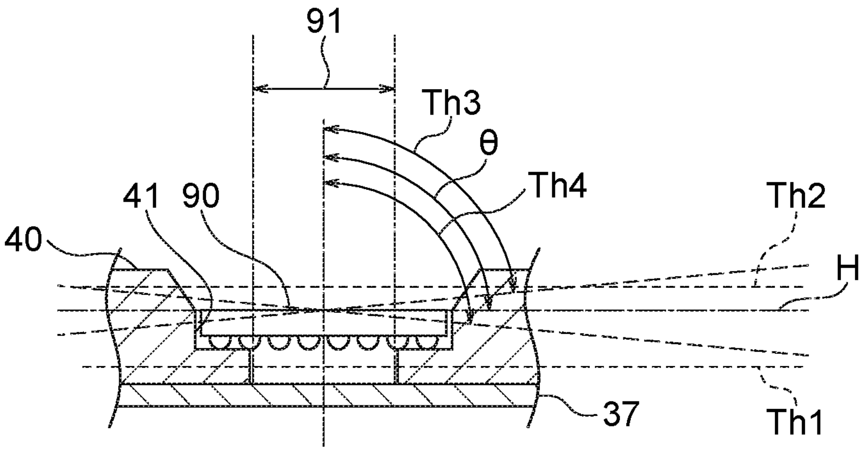
FIGS. 11A-11D are diagrams showing the determination processing of step S70 of FIG. 6.

Specifically, as shown in FIG. 11A, when the height H of the predetermined region 91 in the pocket 41 is greater than or equal to the first threshold Th1 and less than or equal to the second threshold Th2 (Th1≤H≤Th2), and the slope θ of the predetermined region 91 is greater than or equal to the third threshold Th3 and less than or equal to the fourth threshold Th4 (Th3≤θ≤Th4), the determination unit 65 determines that the DUT 90 is normally accommodated in the pocket 41.

Here, the first to fourth threshold values Th1~Th4 are thresholds stored in advance in the arithmetic unit 60 for determining the accommodation status of the DUT 90. The first threshold Th1 is a threshold for judging so-called "no devices", and is lower in height than the surfaces of the DUT 90 normally accommodated in the pockets 41. On the other hand, the second threshold value Th2 is a threshold value for judging so-called "double placement", and is a threshold value high than the surface of the DUT 90 normally accommodated in the pockets 41 and larger than the first threshold value Th1.

The third and fourth threshold Th3,Th4 is a threshold value for determining the incline state of the DUT 90 in the pocket 41, the third threshold Th3 is a lower limit value of the inclination of the DUT 90 with respect to the vertical direction, the fourth threshold Th4 is an upper limit value of the inclination of the DUT 90 with respect to the vertical direction.

Figure 11B:
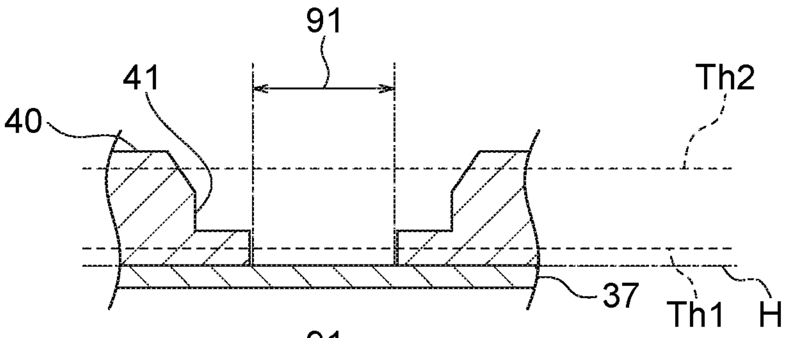

On the other hand, as shown in FIG. 11B, when the height H of the predetermined region 91 in the pocket 41 is less than the first threshold Th1 (H<Th1), the determination unit 65 determines that the DUT 90 is not accommodated in the pocket 41 (no devices). That is, when the height H of the predetermined region 91 is less than the first threshold Th1, the determination unit 65 determines that the DUT 90 accommodation condition in the pockets 41 is abnormal.

Figure 11C:
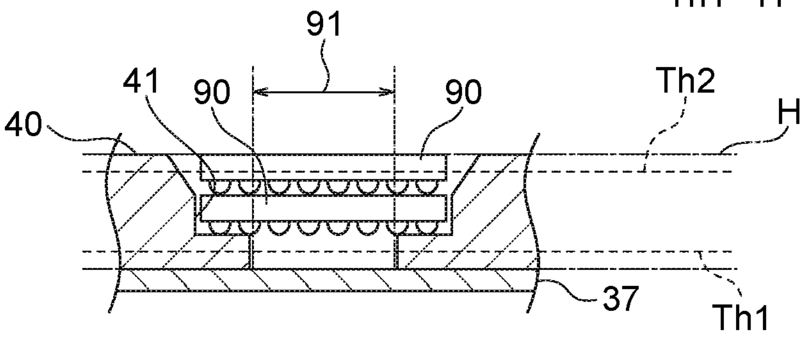

As shown in FIG. 11C, when the height H of the predetermined region 91 in the pocket 41 is larger than the second threshold Th2 (H>Th2), it is determined that two pieces of the DUT 90 are accommodated in one pocket 41 (double placement). That is, also in this instance, the determination unit 65 determines that the accommodation condition of the DUT 90 in the pockets 41 is abnormal.

Figure 11D:
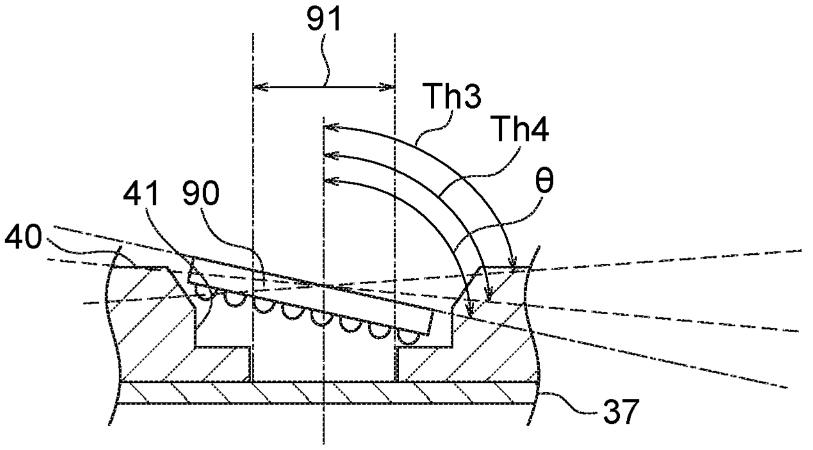

Further, as shown in FIG. 11D, when the incline θ of the predetermined region 91 in the pocket 41 is larger than the fourth threshold Th4 (θ>Th4), the determination unit 65 determines that the DUT 90 is tilted in the pocket 41. In addition, although not particularly illustrated, even when the incline θ of the predetermined region 91 in the pocket 41 is smaller than the third threshold Th3 (θ<Th3), the determination unit 65 determines that the DUT 90 is inclined in the pocket 41. That is, also in these cases, the determination unit 65 determines that the accommodation condition of the DUT 90 in the pockets 41 is abnormal.

In step S50 of FIG. 6, the extraction unit 64 and the determination unit 65 of the arithmetic unit 60 execute the process of the above-described step S60, S70 for all the pockets 41 of the buffer plate 40. When the process of the step S60, S70 is completed for all the pockets 41 (YES in step S80), the arithmetic unit 60 outputs, for example, information on the pockets 41 in which the DUT 90 accommodation conditions are abnormal to the control unit (not shown) of the pick-and-place device 31.

Thus, the pick-and-place device 31 can recognize the abnormal pocket 41 in advance before the DUT 90 accommodation approaches the abnormal pocket 41. Therefore, in the state embodiment, even if the pockets 41 of "no device" or "double placement" are present in the buffer plate 40 or are accommodated in the pockets 41 of the buffer plate 40 with the DUT 90 inclined, the pick-and-place device 31 can perform a process of skipping these pockets 41 and the like, and can improve the operation rate of the electronic component handling apparatus and reduce the damage of the DUTs.

As described above, in the present embodiment, the first correction unit 61 corrects the shape data D2 of the buffer plate 40 based on the rotation amount and the movement amount of the buffer plate 40 with respect to the initial state. Thus, the accommodation state of the DUT 90 is determined after correcting the deviation from the initial state due to the rotational and moving of the buffer plate 40. This allows to accurately determine the accommodation state of the DUT 90.

Embodiments heretofore explained are described to facilitate understanding of the present invention and are not described to limit the present invention. It is therefore intended that the elements disclosed in the above embodiments include all design changes and equivalents to fall within the technical scope of the present invention.

For example, although the correction by the first correction unit 61 and the second correction unit 62 is applied to the buffer plate 40 in the present embodiment, the correction may be applied to, for example, the customer tray 80 held by the set plate 35. Accordingly, even when a plurality of relatively small the DUT 90 are accommodated in the relatively large customer tray 80 at room temperature, it is possible to improve the accuracy of detecting the DUT 90.

In the present embodiment, the pitch change amount of the pocket 41 is calculated based on the four reference marks 42 of the buffer plate 40, but the method of calculating the pitch change amount of the pocket 41 is not particularly limited thereto. For example, a reference mark may be provided in the vicinity of each pocket 41, and the pitch change amount may be calculated by calculating the distance between the pockets 41 from the interval between the reference marks. This makes it possible to set the predetermined region 91 with high accuracy with respect to the shape data of the buffer plate 40 even when the pitch change amount of the pocket 41 is not uniform as a whole in the buffer plate 40.

Figure 12:
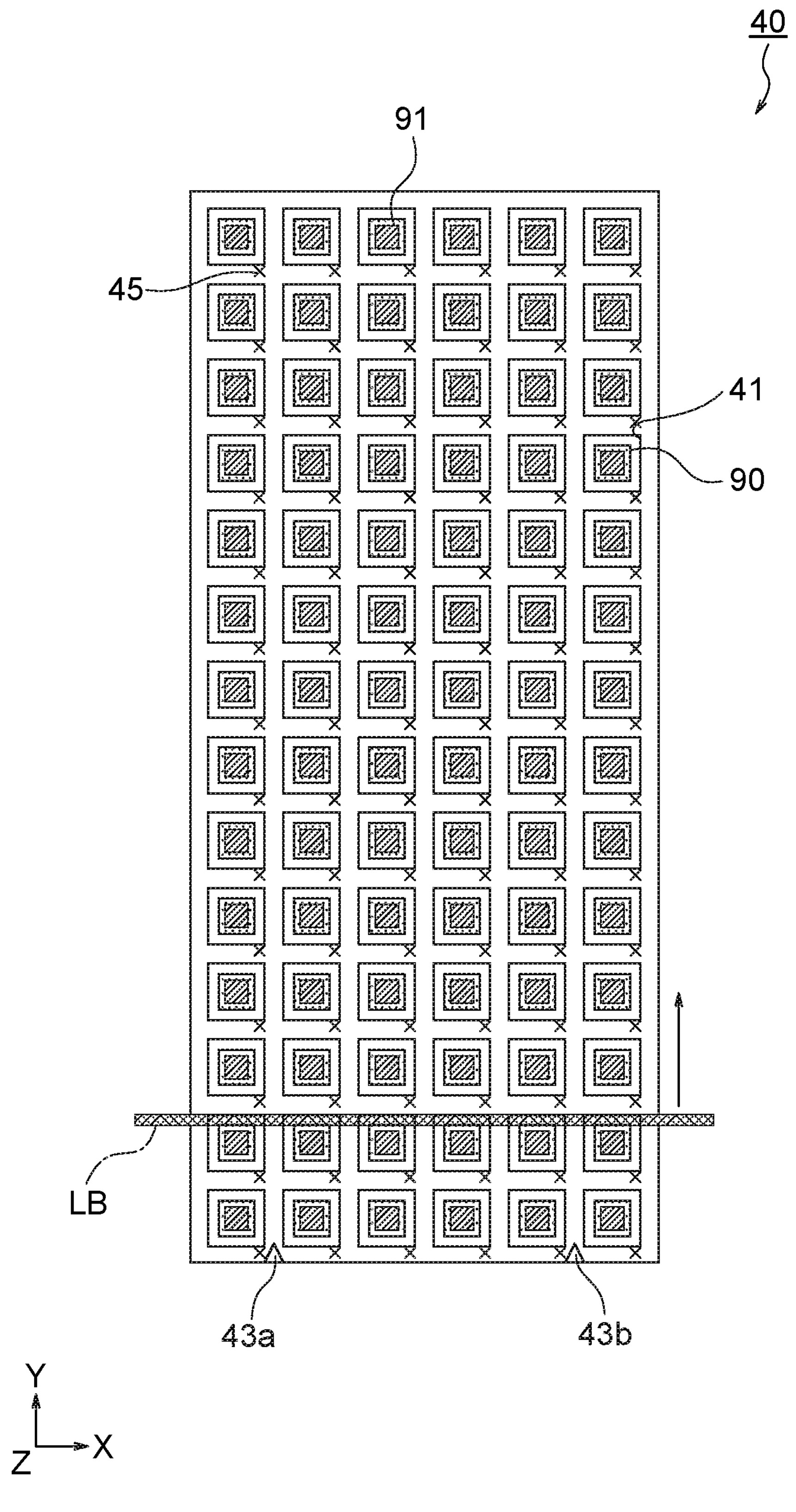
FIG. 12 is a plan view showing a buffer plate 40 used in a modification of the electronic component handling apparatus according to the present embodiment.

FIG. 12 is a plan view showing a buffer plate 40 used in a modification of the handler 30 according to the present embodiment.

In the present embodiment, the predetermined region 91 is set based on the origin OP of the coordinate system CS, but the method of setting the predetermined region 91 is not particularly limited thereto. For example, as shown in FIG. 12, reference marks 45 are provided in the vicinity of each pocket 41 of the buffer plate 40, and predetermined regions 91 may be set for each pocket 41 based on each reference mark 45. In this embodiment, information on the positional relationship between each reference mark 45 and each predetermined region 91 is stored in the arithmetic unit 60. In this embodiment, even if the buffer plate 40 is deformed by heating and the position of each pocket 41 is changed, the predetermined region 91 can be set in each pocket 41 based on the position of the reference mark 45 by measuring each reference mark 45 from the shape data of the buffer plate 40. Therefore, even when the pitch variation amount of the pockets 41 is not uniform as a whole in the buffer plate 40, the predetermined region 91 can be accurately set with respect to the shape data of the buffer plate 40.

Also, in step S40, in addition to correction based on rotation and movement of the buffer plate 40, the amount of incline of the base plate 37 may be measured to correct the shape data of the buffer plate 40 to eliminate the effect of the tilt of the base plate 37. For the method of measuring the tilt amount of the base plate 37 and the method of correcting the shape data of the buffer plate 40, the method described in Utility Model Registration Publication No. 3227434 can be used.

In addition, after the determination processing in step S80 in the present embodiment, processing for correcting the height H and the incline θ of the predetermined region 91 may be performed in order to eliminate the influence of the deflection of the buffer plate 40 itself. As a method of correcting the height H and the inclination θ of the predetermined region 91, the method described in Utility Model Registration Publication No. 3227434 can be used.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

EXPLANATIONS OF LETTERS OR NUMERALS

1 Electronic component testing apparatus
- 10 Test head
- 15 Socket
- 20 Tester
- 25 Cable
- 30 Handler
- 301 Space
- 302 Opening
- 303 Main base
- 304 Window
- 31 Pick-and-place device
- 32 Contact arm
- 33 Buffer plate moving device
- 37 Base plate
- 38 Rail
- 34 Chamber
- 35 Set plate
- 36 Lifting device
- 40 Buffer plate
  - 41 Pocket
  - 42*a*, 42*b*, 42*c*, 42*d* Reference marks
  - 43*a*, 43*b* Reference mark
  - 44 Opening
  - 45 Reference mark
- 50 Accommodation state determining device
  - 51 Sensor
  - 52 Moving device
  - 60 Arithmetic unit

61 First correction unit
62 Second correction unit
63 Setting unit
64 Extraction unit
65 Determination unit
- 70 Jig
  - 71, 72 Convex portion
- 80 Customer tray

90 DUT
- 91 Predetermined region

LB Laser beam
D1, D2 Shape Data
CS Coordinate system
OP Origin

The invention claimed is:

1. An electronic component handling apparatus that handles a device under test (DUT), the electronic component handling apparatus comprising:

an acquiring device that acquires current three-dimensional shape data of a DUT container having a plurality of accommodating portions each capable of accommodating the DUT; and a computer device that:

calculates a first correction amount from the current three-dimensional shape data and corrects the current three-dimensional shape data based on the first correction amount;

extracts, from the corrected three-dimensional shape data, at least one of a height and a slope of each of predetermined regions of the DUT container, wherein each of the predetermined regions corresponds to the DUT in each of the accommodating portions; and determines an accommodation state of the DUT based on an extraction result of the at least one of the height and the slope, wherein the first correction amount represents at least one of a movement amount and a rotation amount in a planar direction of the current three-dimensional shape data with respect to an initial state of the DUT container set in advance.

2. The electronic component handling apparatus according to claim 1, wherein the computer device further calculates a second correction amount from the current three-dimensional shape data and corrects a relative positional relationship among the predetermined regions based on the second correction amount, and the second correction amount is a change amount of a relative positional relationship of each of the accommodating portions with respect to the initial state.

3. The electronic component handling apparatus according to claim 1, wherein the DUT container has a plurality of first reference points, the acquiring device acquires initial three-dimensional shape data of the initial state at room temperature, and the computer device calculates the first correction amount based on, among the first reference points, first reference points both in the current three-dimensional shape data and the initial three-dimensional shape data.

4. The electronic component handling apparatus according to claim 1, further comprising:

a holding device that holds the DUT container, wherein the acquiring device acquires a specific position of a jig held by the holding device or a specific position of the holding device, and the initial three-dimensional shape data include a coordinate system set based on the specific position.

5. The electronic component handling apparatus according to claim 2, wherein the DUT container has a plurality of first reference points, and the computer device calculates the second correction amount based on the number of the accommodating portions, and among the first reference points, a first reference point of the current three-dimensional shape data.

6. The electronic component handling apparatus according to claim 5, further comprising:

a holding device that holds the DUT container, wherein the computer device sets the predetermined regions;

the acquiring device acquires a specific position of a jig held by the holding device or a specific position of the holding device;

the computer device:

corrects a positional relationship among the predetermined regions in design data of the predetermined regions, and sets the predetermined regions by applying the design data of the corrected predetermined regions to the current three-dimensional shape data based on a coordinate system set from the specific position.

7. The electronic component handling apparatus according to claim 1, wherein the DUT container has a plurality of second reference points corresponding to the accommodating portions, and the computer device sets the predetermined regions with respect to the current three-dimensional shape data based on the second reference points.

8. The electronic component handling apparatus according to claim 1, wherein the computer device:

determines that the DUT is not accommodated in each of the accommodating portions when the height of each of the predetermined regions is less than a first threshold, determines that the DUT is accommodated in each of the accommodating portions when the height of each of the predetermined regions is greater than a second threshold that is greater than the first threshold, determines that the DUT is tilted in each of the accommodating portions when the incline of each of the predetermined regions is less than a third threshold, or greater than a fourth threshold that is greater than the third threshold, and determines that the DUT is normally accommodated in each of the accommodating portions when the height of each of the predetermined regions is greater than or equal to the first threshold, less than or equal to the second threshold, and the tilt of each of the predetermined regions is greater than or equal to the third threshold, and less than or less than the fourth threshold.

9. The electronic component handling apparatus of claim 1, further comprising:

a chamber that applies a thermal stress to the DUT, and the DUT container is a buffer plate that has a plurality of concave pockets as the accommodating portions and that is disposed or accessible within the chamber.

10. The electronic component testing apparatus that tests a device under test (DUT), comprising:

a test head having a socket to which the DUT is electrically connected;

an electronic component handling apparatus according to claim 1 that moves the DUT to be pressed against the socket; and a tester electrically connected to the test head.

* * * * *